US006181191B1

(12) United States Patent
Paschal

(10) Patent No.: US 6,181,191 B1
(45) Date of Patent: Jan. 30, 2001

(54) DUAL CURRENT SOURCE CIRCUIT WITH TEMPERATURE COEFFICIENTS OF EQUAL AND OPPOSITE MAGNITUDE

(75) Inventor: Matthew James Paschal, Rochester, MN (US)

(73) Assignee: International Business Machines Corporation, Armonk, NY (US)

( * ) Notice: Under 35 U.S.C. 154(b), the term of this patent shall be extended for 0 days.

(21) Appl. No.: 09/388,313

(22) Filed: Sep. 1, 1999

(51) Int. Cl.[7] .................................................... H03K 5/22

(52) U.S. Cl. ............................................ 327/513; 327/83

(58) Field of Search .................................. 327/512, 513, 327/83, 89, 77, 53, 539

(56) References Cited

U.S. PATENT DOCUMENTS 6,069,501 * 5/2000 Hachiya et al. ....................... 327/83
6,084,462 * 7/2000 Barker .................................... 327/83

OTHER PUBLICATIONS

Meyer and Gray, *Analysis and Design of Analog Integrated Circuits*, John Wiley & Sons, 1984, pp. 275–295.

* cited by examiner

*Primary Examiner*—Jung Ho Kim
(74) *Attorney, Agent, or Firm*—Karuna Ojanen

(57) ABSTRACT

A dual current source circuit provides dual currents of the same magnitude and having coefficients of temperature compensation that are also equal but opposite. The core of the circuit is a degenerated differential pair of bipolar junction transistors wherein the base of a first transistor of the pair is connected to a bandgap voltage reference. The base of the second transistor of the pair is connected to a PTAT current source having only one of a positive or a negative coefficient of temperature compensation and a resistor which generates a voltage difference between the bases of the two transistors. This voltage difference generates dual currents, each having equal but opposite coefficients of temperature compensation. A temperature independent stable tail current is provided to the transistors and can be generated by summing the current output of a negative PTAT current source and a positive PTAT current source.

12 Claims, 3 Drawing Sheets

DUAL CURRENT SOURCE CIRCUIT WITH TEMPERATURE COEFFICIENTS OF EQUAL AND OPPOSITE MAGNITUDE

This invention relates generally to a current source for electronic circuits that are sensitive to temperature fluctuations and more particularly to a dual current source to provide constant current having selectable temperature coefficients of equal but opposite magnitude.

BACKGROUND OF THE INVENTION

It is desirable for electronic circuits to maintain a constant performance output irrespective of temperature. Not only do external environmental temperatures of an electronic circuit fluctuate but electronic circuits generate thermal energy which increases the internal temperature of the circuit and affects its performance. As an example, it is well known that the output of current sources and current mirrors vary with temperature. The output current of these current sources, moreover, may drive or bias loads located on a separate integrated circuit or chip which may have a response to temperature change that has been characterized. Such an off chip load is the vertical cavity surface emitting laser (VCSEL), a semiconductor laser which emits light parallel to the direction of the optical cavity. For these applications, a constant current source having a positive and/or a negative coefficient of temperature compensation is desirable. With such a constant current source, a new temperature coefficient can be selected in the current driver by changing the input if the temperature coefficients of all possible loads are not equal. If the temperature coefficient of the load is unknown at the time of manufacture and has to be characterized, moreover, flexibility to compensate for the temperature response is essential.

A key concept of a constant current source circuit is that the magnitude of the current does not change; rather the temperature coefficient associated with the current varies. As an example, if the load driven by the output current is a VCSEL and if the optical power output of the VCSEL has a negative optical power temperature coefficient, then the optical power output decreases with increasing temperature at constant current. To maintain constant optical output power throughout a temperature range, the VCSEL with the negative temperature coefficient has to be compensated by additional current from a current source having a positive temperature coefficient. If the temperature coefficient of the VCSEL and the current source temperature coefficient match in magnitude, but are opposite in sign, the optical output of the VCSEL will remain constant.

Several techniques may be used to compensate for temperature variations of a constant current source or mirror. A bandgap reference may be used to obtain a current having a zero temperature coefficient in that the current does not change as a function of temperature. A constant current source having a negative temperature coefficient, or a constant current source having a positive temperature coefficient may be used for compensation. In any of these three temperature compensation circuits, the magnitude of the current variation per degree change in temperature, also called the coefficient of temperature compensation or simply the temperature coefficient is permanently set by choosing semiconductor device dimensions, i.e., emitter widths, resistor values, or MOSFET device dimensions. Once the temperature compensation circuit is manufactured, the temperature coefficient cannot be changed. These techniques, therefore, are not suitably responsive to match the temperature coefficients of many different loads.

Several methods exist to generate currents with high temperature dependence. These generally involve using the temperature dependence of a voltage difference between the base and the emitter of a bipolar transistor or the temperature dependence of the threshold voltage of a field effect transistor. To generate a current having a larger temperature coefficient than one generated from a single bipolar or field effect transistor, two currents with opposite temperature coefficients can be subtracted from one another. Subtracting a first current with a negative temperature coefficient from a second current with a positive temperature coefficient results in a third current with a positive temperature coefficient that is larger than the temperature coefficient of the second current. Similarly, subtracting a first current with a positive temperature coefficient from a second current with a negative temperature coefficient results in a third current with a negative temperature coefficient that is larger than the temperature coefficient of the second current. Two currents can be generated with this method that have equal but opposite temperature coefficients; however, the process tolerance of these two temperature coefficients make this method inappropriate under certain circumstances such as for use in the digitally controlled reference of FIG. 1 as will be discussed because the result of two currents that are added or subtracted is very dependent on process tolerance.

It is thus an object of the present invention to provide a dual current source with equal and opposite temperature coefficients that are independent of power supply and process tolerances.

SUMMARY OF THE INVENTION

In one embodiment, the invention may be considered a dual current source circuit, comprising a pair of transistors arranged as a degenerated differential pair; a bandgap voltage source connected to the base/gate of one transistor of the pair; a first current source having a temperature dependent current; and a resistor connected to the base/gate of the other transistor of the pair and to the first current source wherein the voltage difference across the degenerated differential pair of transistors generates equal dual currents, each current having a coefficient of temperature compensation that is also equal in magnitude but of opposite sign. The transistors of the degenerated differential pair of the dual current source circuit may be selected from the group consisting of pnp bipolar transistors, p-channel enhancement MOSFETs, p-channel depletion MOSFETs, GASFETs, or JFETs and the first current source sinks current. In another embodiment, the transistors of the degenerated differential pair of transistors of the dual current source circuit may be selected from the group consisting of npn bipolar transistors, n-channel enhancement MOSFETs, n-channel depletion MOSFETs, GASFETs, or JFETs and said first current source sources current. The dual current source may further comprise a temperature independent current applied to the emitters/sources of the transistor pair. Two current mirrors may be connected to collectors/drains of each transistor of the transistor pair to output each one of the dual currents . The output dual currents may be connected to a constant current source. A second resistor of the degenerated differential pair of transistors may control the magnitude of the coefficient of temperature compensation. The temperature independent current may determine the magnitude of the dual currents. The first current source having the first coefficient of temperature compensation influences the magnitude of the second coefficient of temperature compensation. The first current source may be derived from a proportional to absolute temperature current source. The temperature independent current may be derived from summing a copy of the first current with a second current from a second proportional to absolute temperature current source.

Another aspect of the invention is a dual current source circuit, comprising a pair of transistors arranged as a degenerated differential pair; a bandgap voltage source connected to the base/gate of one of the pair of transistors; a proportional to absolute temperature current source to generate a temperature dependent current; a resistor connected to the base/gate of the other transistor of the pair of transistors and to the temperature dependent current; a temperature independent current derived from summing a copy of the temperature dependent current of one sign with a second temperature dependent current of the other sign from a second proportional to absolute temperature current source with the temperature independent current applied to the emitters/sources of the degenerated differential transistor pair; and two current mirrors, one of the current mirrors connected to one each of the collectors/drains of the pair of transistors to output dual currents wherein the voltage difference across the pair of degenerated differential transistors generates equal dual currents, each current of said dual currents having a coefficient of temperature compensation that is also equal in magnitude but of opposite sign, with a second resistor of the degenerated differential pair of transistors controlling the magnitude of the coefficient of temperature compensation, and the temperature independent current determines the magnitude of the dual currents, and the first temperature dependent current further influences the magnitude of the coefficient of temperature compensation.

The invention may also be considered a dual current source, comprising a means to generate a first current having a first coefficient of temperature compensation; a means to input a bandgap reference voltage into a dual current generating means; a means to sense a voltage difference between the bandgap reference voltage and a voltage derived from the first current generating means; the dual current generating means to generate equal dual currents from the voltage difference, each of the dual currents having a second coefficient of temperature compensation that is equal in magnitude but opposite in sign to the other of the dual currents. The dual current source may further comprise means to vary the magnitude of the dual currents; and means to vary the magnitude of the coefficient of temperature.

Another aspect of the invention may be a dual current source circuit, comprising a degenerated differential pair of transistors wherein temperature dependence of the circuit resides in one of the transistors of the pair of transistors so that dual output currents of the circuit comprises a first current having a positive coefficient of temperature compensation and a second current having a negative coefficient of temperature compensation, wherein the coefficients of temperature compensation are equal in magnitude.

The invention may further be understood with reference to the drawings and the detailed description following therefrom.

DESCRIPTION OF THE PREFERRED EMBODIMENTS

Figure 1:
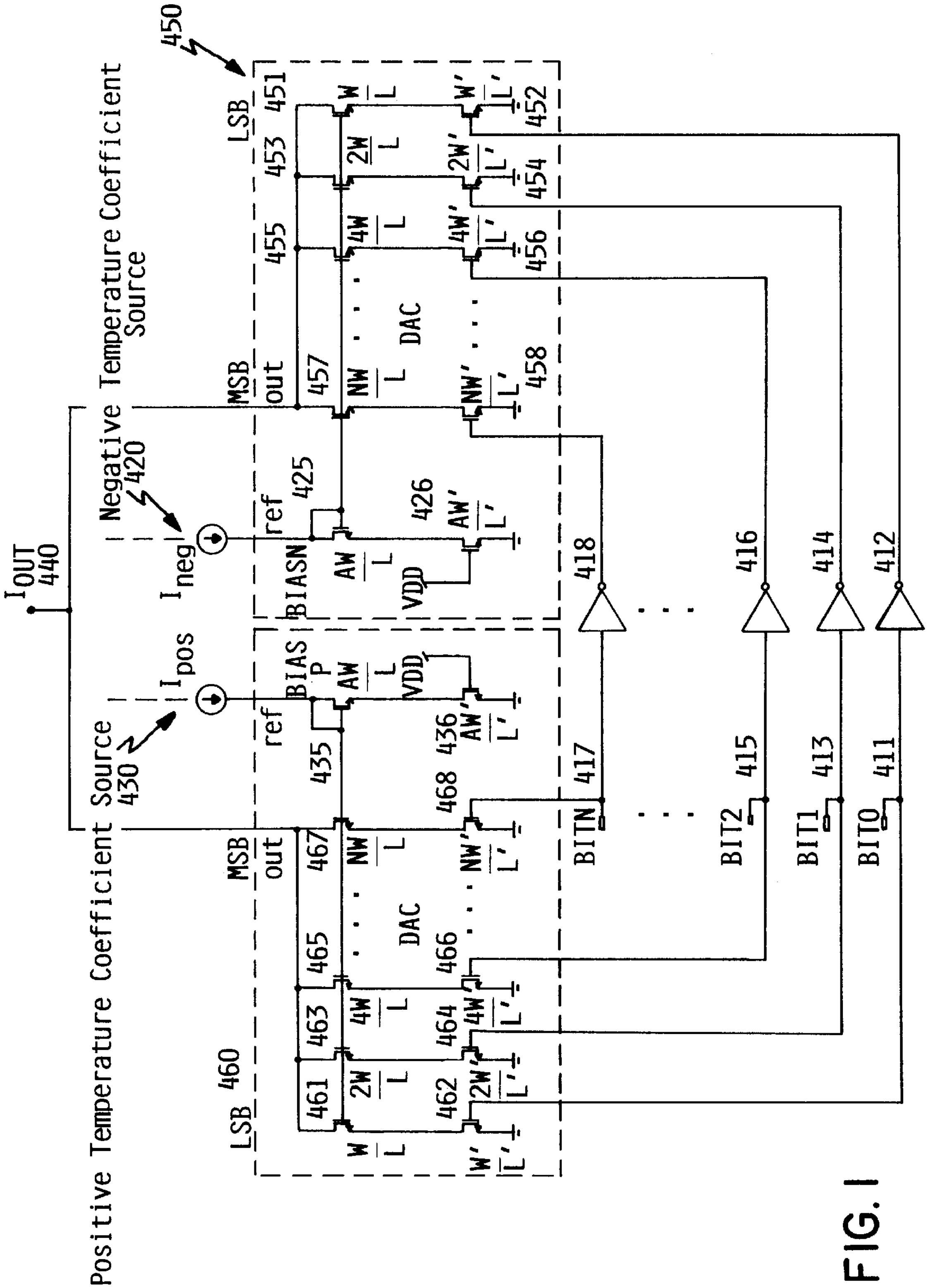
FIG. 1 is a circuit diagram of a digitally programmable constant current source that can take advantage of the dual current source described herein.

A simplified circuit diagram of a constant current source circuit which mixes current from a current source having a positive temperature coefficient with current from a second current source having a negative temperature coefficient in programmable proportions is shown in FIG. 1. The constant current source is the subject of a patent application entitled, "Constant Current Source Circuit with Variable Temperature Compensation", Ser. No. 09/218,340 filed Dec. 22, 1998, assigned to the assignee herein and hereby incorporated by reference it its entirety. Two current sources, 420 and 430, are provided. A first current source 420 has a negative temperature coefficient such that as the temperature increases, the amount of current supplied from the current source 420 decreases. Output current from current source 420 decreases when the temperature increases, at an exemplary rate of, by way of example only, −1.3 percent per degree Celsius. A second current source 430 has a positive temperature coefficient in which current increases as the temperature of the current source 430 increases. Output current from current source 430 increases when the temperature increases, at an exemplary rate of, by way of example only, +1.3 percent per degree Celsius.

Connected to the current source having the negative temperature coefficient 420 are transistors 425 and 426; likewise connected to the current source having the positive temperature coefficient 430 are transistors 435 and 436. N-type MOSFETs [hereinafter referred to as nfets] 425, 426, 435, and 436 create a necessary bias voltage from the input current, which bias voltage is connected to non-switching transistors, 451, 453, 455, 461, 463, 465, etc. Also connected to nfet 425 is a current digital-to-analog converter (DAC) 450 and connected to nfet 435 is a complementary digital-to-analog converter 460. Current digital-to-analog converter 450 comprises a plurality of nfets shown as 451 and its corresponding switch 452, and 453, 455, and 457 and their respective nfet switches 454, 456, 458. Nfet 451 having a width to length ratio of W/L is matched with and connected through switch 452, inverter 412, and switch 462 to its complementary nfet 461 of the same width to length ratio, W/L. Likewise each nfet 453, 455, 457 in digital-to-analog converter 450 is connected to its respective matching complementary nfet 463, 465, 467 in digital-to-analog converter 460 through respective corresponding switches 454 and 464, 456 and 466, 458 and 468 and respective inverters 414, 416, 418. Input bits 411, 413, 415, 417 determine whether to switch a respective corresponding nfet 452 or 462, 454 or 464, 456 or 466, and 458 or 468 on or off. If the input bit 411 is high, the gate of switch 462 is high and nfet 461 is on; the inverter 412 turns the gate of switch 452 low which turns off nfet 451. Thus, with the inverters 412, 414, 416, 418 arranged as illustrated, when the nfet 451, 453, 455, 457 in one digital-to-analog converter 450 is on, then the complementary nfet (461, 463, 465, 467) in the other digital-to-analog converter 460 is off. Discrete changes of temperature coefficients of $I_{out}$ 440 are selectable by inputting a digital signal enabling a specified combination of switches and conductive nfets.

Current sources 420, 430 may be current generators or current mirrors. In some applications of the constant current source of FIG. 1, it is preferable that current sources 420, 430 be matched, i.e., that the sources be capable of providing dual currents having identical magnitude but the same temperature coefficients of opposite signs.

Figure 2:
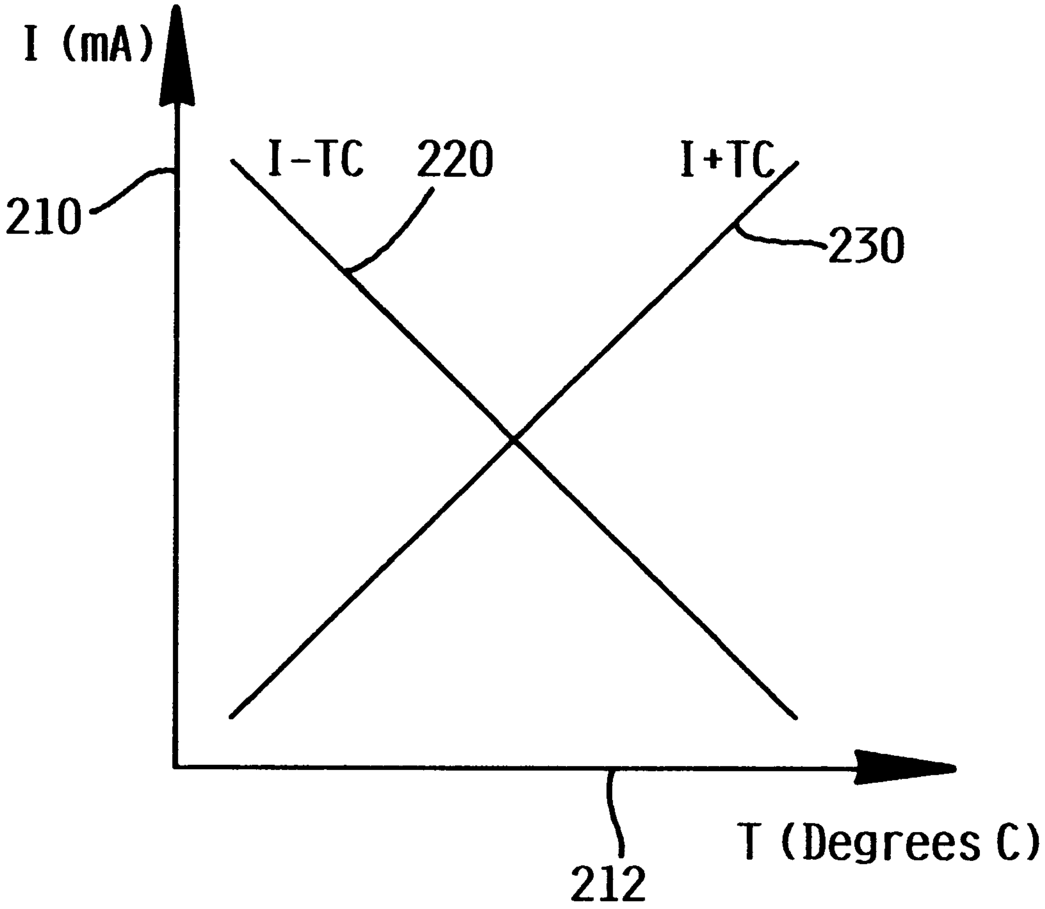
FIG. 2 is a plot of the current output of a dual current source having temperature coefficients of equal and opposite magnitudes versus temperature in accordance with principles of the invention.
Figure 3:
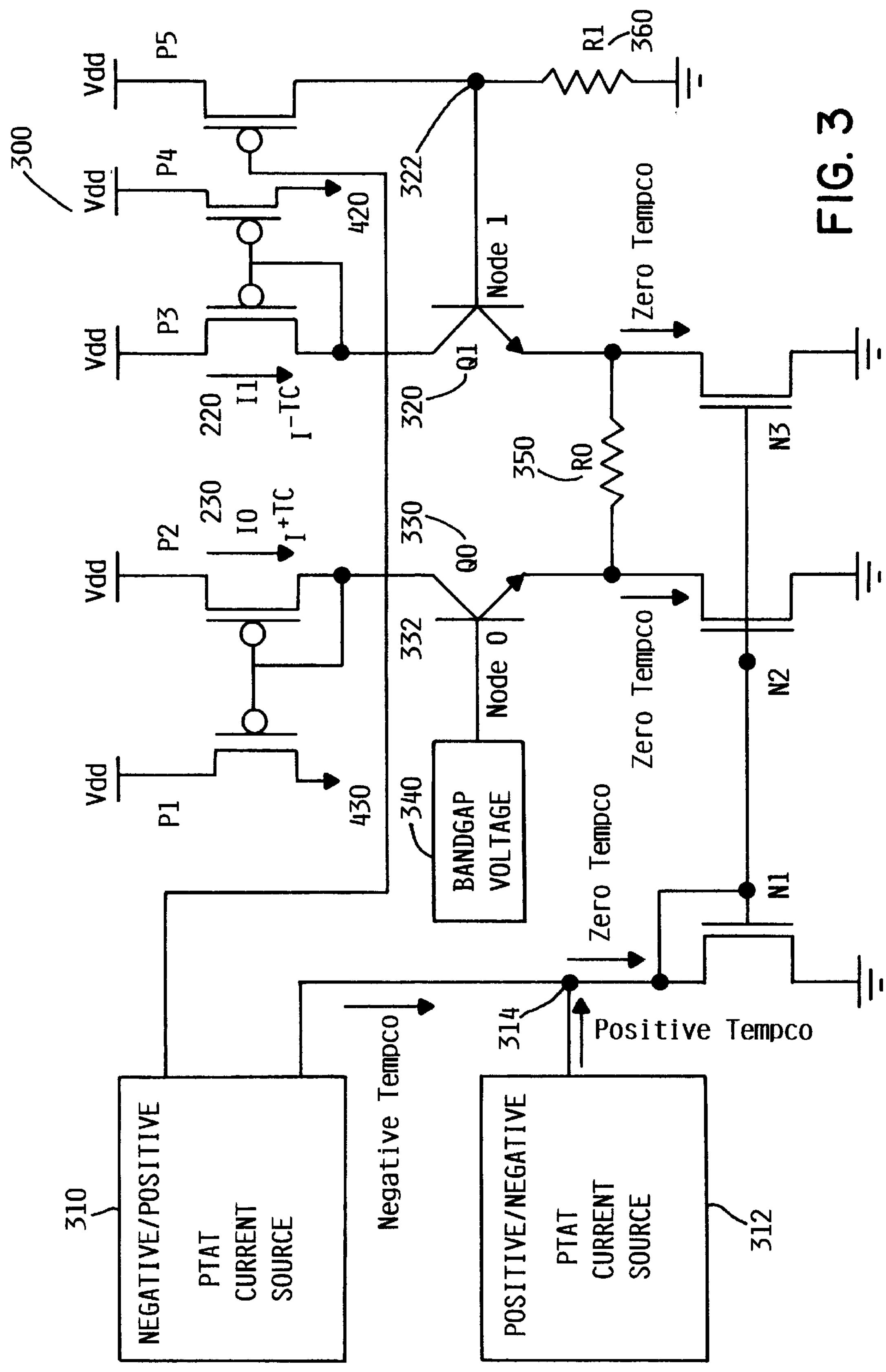
FIG. 3 is a simplified circuit diagram of a dual current source according to principles of the invention. It is suggested that FIG. 3 be printed on the cover of the patent.

FIG. 2 is a plot of the output current versus temperature of the currents sources 420 and 430 of FIG. 1 when the current source 420, 430 provide currents that are equal but have opposite coefficients of temperature compensation. Current is represented on the vertical axis 210 and temperature is represented on the horizontal axis 212. The output current having a negative temperature coefficient is represented by the line $I^{-TC}$ 220 having a negative slope of value −X% per degree Celsius. The output current having a positive temperature coefficient is represented by the line $I^{+TC}$ 230 having a positive slope of value +X% per degree Celsius. The slope of each line is the negative of the other wherein the slope represents the temperature coefficient. It is preferable that both $I^{-TC}$ 220 and $I^{+TC}$ 230 have equal but opposite temperature coefficients regardless of power supply and process variations for the constant current sources of FIG. 1 to operate properly in certain applications. FIG. 3 is a simplified circuit diagram of a dual current source capable of providing the matched current input at 420 and 430 in FIG. 1 and as further described with respect to FIG. 2.

Referring now to FIG. 3, a circuit diagram of a constant current source to provide dual currents is shown. The dual current source 300 is connected to a proportional to absolute temperature (PTAT) current source 310 that produces a current having either a positive or a negative temperature coefficient which is independent of power supply variations. Current having an opposite coefficient of temperature compensation is generated from a second PTAT current source 312, also capable of generating a stable current independent of power supply variations. PTAT current sources and bandgap references are known in the art and examples are given in Gray and Meyer, *ANALYSIS AND DESIGN OF ANALOG INTEGRATED CIRCUITS*, John Wiley & Sons, 1984, pp. 275–295. These two currents are summed at node 314 to produce a stable current having a zero temperature coefficient which is mirrored by grounded nfets N1, N2, and N3. This part of the circuit 300 produced by the current mirror of grounded nfets N1, N2, and N3 is temperature independent in that the current through these devices is constant and has a zero temperature coefficient. The currents in nfets N1, N2, and N3 play a critical role in minimizing other temperature dependencies in the circuit other than the desired temperature dependency at node1 322 as will be discussed.

Within the circuit 300 is a degenerated differential pair of transistors 320 and 330. A degenerated differential pair of transistors is one in which a resistor is connected between the emitters of a pair of bipolar junction transistors; and in the case of field effect transistors, the width-to-length ratio is decreased or the sources are connected across a common resistor. In the embodiment of FIG. 3, transistors 330 and 320 preferably are matched bipolar junction transistors positioned adjacent to one another and are connected across resistor R0 350 to form the degenerated differential pair having a common tail current through nfets N2 and N3 that is temperature independent. Other transistors could be used such as field effect transistors in which case the sources of the transistors would be connected across a common resistor, however, bipolar transistors have better characteristics with respect to temperature changes. A bandgap voltage circuit 340 with a zero temperature coefficient is connected to node0 332, which is the base/gate of transistor 330 of the degenerated differential pair. The base/gate of the other transistor 320 is connected to node1 322. Node1 322 receives the current output of p-type MOSFET (pfet) P5 having either a positive or a negative temperature coefficient wherein the gate of P5 is connected to a voltage output from the PTAT current source 310. Pfet P5 could easily be incorporated into the PTAT current source. The emitters/sources of the degenerated differential pair of transistors are connected across the common resistor R0 350 and also to the tail current provided by nfets N2 and N3. The collectors/drains of the degenerated differential pair of transistors 320, 330 may be connected to pfets P2 and P3, respectively.

The operation of the dual current source 300 will now be described. A temperature dependent voltage is generated at node1 322 by forcing the temperature dependent current from pfet P5 through a temperature independent resistor R1 360. This voltage difference ($V_{332}-V_{322}$) generates a current on each leg of the differential pair of transistors 320, 330; the current in each being equal in magnitude but having a coefficient of temperature compensation that is opposite in sign but whose magnitude is equal as well. As the voltage difference between node0 332 and node1 322 ($V_{332}-V_{322}$) increases, the current $I^{+TC}$ 230 increases and the current $I^{-TC}$ 220 decreases. Conversely, as the voltage difference between node0 332 and node1 322 ($V_{332}-V_{322}$) decreases, the current $I^{+TC}$ 230 decreases while the current $I^{-TC}$ 220 increases. The differential transistor pair causes $\Delta I^{+TC}/\Delta T=\Delta I^{-TC}/\Delta T$. The magnitude of the temperature coefficient is set by the emitter degeneration resister R0 350 thus the process tolerance of R0 350 causes the magnitude of the temperature coefficients of $I^{+TC}$ 230 and $I^{-TC}$ 220 to vary but the above equality remains valid in that the temperature coefficients of $I^{+TC}$ 230 and $I^{-TC}$ 220 change by the same amount. The magnitude of the tail currents through N2 and N3 cause the magnitude of $I^{+TC}$ 230 and $I^{-TC}$ 220 to vary although the temperature coefficients do not change. The process variation of the slope of the current through pfet P5 with respect to temperature also causes the magnitude of the temperature coefficient of $I^{+TC}$ 230 and $I^{-TC}$ 220 to vary. The above equality, however, remains valid because both the temperature coefficient of $I^{+TC}$ 230 and $I^{-TC}$ 220 change equally. It is the use of the degenerated differential transistor pair that causes the equality to be independent of the values of R0 350, independent of the tail current through nfets N2 and N3, and independent of the temperature coefficient of the current through pfet P5. Current $I^{-TC}$ 220 can then be mirrored at pfets P3 and P4 to yield the negative temperature coefficient current source 420 at FIG. 1; similarly, the current mirror of pfets P1 and P2 allow output current $I^{+TC}$ 230 having a positive temperature coefficient to be input as the current source 430 of FIG. 1.

Pfets P1, P2, P3, and P4 are optional. Preferably they are matched and connected to the same power supply $V_{dd}$. It is preferred, moreover, that the resistance values of R0 350 and R1 360 be set during manufacture but to avoid process variations and to obtain more precise control, these resistors can be external to the dual current source 300.

While various embodiments of the present invention have been described above, it should be understood that they have been presented by way of example, and not limitation, and variations are possible. One of ordinary skill in the art would know that one could easily change the sign of the temperature coefficients of the PTAT current sources 310 and 312. One of ordinary skill in the art would also know that pfets and nfets would be replaced with the other with appropriate changes as necessary. The degenerated differential pair could comprise npn bipolar junction transistors if an output current source is desired; or a pnp bipolar junction transistor if an output current sink is desired. The values of the resistors and the currents, the polarity of the temperature coefficients, etc. would change according to particular applications, as is known to one skilled in the art Thus, the breadth and scope of the present invention should not be limited by any of the above-described exemplary embodiments, but should be defined only in accordance with the following claims and their equivalents.

What is claimed is:

1. A dual current source circuit, comprising:

a pair of transistors arranged as a degenerated differential pair;

a bandgap voltage source connected to the base/gate of one of said pair of transistors;

a first current source having a temperature dependent current;

a resistor connected to the base/gate of the other of said pair of transistors and to said first current source;

wherein a voltage difference across said pair of degenerated differential transistors generates equal dual currents, each of said dual currents having a coefficient of temperature compensation that is also equal in magnitude but of opposite sign.

2. The dual current source circuit of claim 1 wherein the transistors are selected from the group consisting of pnp bipolar transistors, p-channel enhancement MOSFETs, p-channel depletion MOSFETs, GASFETs, or JFETs and said first current source sinks current.

3. The dual current source circuit of claim 1 wherein the transistors are selected from the group consisting of npn bipolar transistors, n-channel enhancement MOSFETs, n-channel depletion MOSFETs, GASFETs, or JFETs and said first current source sources current.

4. The dual current source of claim 1, further comprising:

a temperature independent current applied to the emitters/sources of said transistor pair; and two current mirrors connected to collectors/drains of said pair of transistors to output said dual currents .

5. The dual current source of claim 4, wherein said output dual currents are connected to a constant current source.

6. The dual current source of claim 1, wherein a second resistor of said degenerated differential pair of transistors controls the magnitude of said coefficient of temperature compensation and said temperature independent current determines the magnitude of said dual currents.

7. The dual current source of claim 6, wherein said temperature dependent current influences the magnitude of the coefficient of temperature compensation.

8. The dual current source of claim 4, wherein said first current source is a proportional to absolute temperature current source.

9. The dual current source of claim 7, wherein said temperature independent current is derived from summing a copy of said first current with a second current from a second proportional to absolute current source having an opposite coefficient of temperature compensation than said first current.

10. A dual current source circuit, comprising:

a pair of transistors arranged as a degenerated differential pair;

a bandgap voltage source connected to the base/gate of one of said pair of transistors;

a proportional to absolute temperature current source to generate a temperature dependent current;

a resistor connected to the base/gate of the other of said pair of transistors and to said temperature dependent current;

a temperature independent current derived from summing a copy of said temperature dependent current with a second current from a second proportional to absolute temperature current source having an opposite coefficient of temperature compensation, said temperature independent current applied to the emitters/sources of said transistor pair; and two current mirrors, one of each of said current mirror connected to the collector/drain of one of each of said transistors pair to output said dual currents, wherein the voltage difference across said pair of degenerated differential transistors generates equal dual currents, each of said dual currents having a coefficient of temperature compensation that is also equal in magnitude but of opposite sign, and a second resistor of said degenerated differential pair of transistors controls the magnitude of said coefficient of temperature compensation;

said temperature independent current determines the magnitude of said dual currents; and said temperature dependent current further influences the magnitude of the coefficient of temperature compensation.

11. A dual current source, comprising:

(a) means to generate a first temperature dependent current;

(b) means to input a bandgap reference voltage into a dual current generating means;

(b) means to sense a voltage difference between said bandgap reference voltage and a voltage derived from said first temperature dependent current generating means;

(c) said dual current generating means to generate equal dual currents from said voltage difference, each of said dual currents having a coefficient of temperature compensation that is equal in magnitude but opposite in sign to the other of said dual currents.

12. The dual current source of claim 5, further comprising:

(d) means to vary the magnitude of said dual currents; and (e) means to vary the magnitude of said coefficient of temperature compensation.

* * * * *